United States Patent
Hong et al.

(10) Patent No.: US 9,369,265 B1
(45) Date of Patent: Jun. 14, 2016

(54) DATA RECEIVER

(71) Applicants: SK hynix Inc., Icheon (KR); SEOUL NATIONAL UNIVERSITY R&DB FOUNDATION, Seoul (KR)

(72) Inventors: Gi-Moon Hong, Seoul (KR); Suhwan Kim, Seoul (KR); Deog-Kyoon Jeong, Seoul (KR)

(73) Assignees: SK HYNIX INC., Icheon (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 14/882,784

(22) Filed: Oct. 14, 2015

(30) Foreign Application Priority Data

Apr. 10, 2015 (KR) .................. 10-2015-0050625

(51) Int. Cl.
*H04L 7/00* (2006.01)
*H04L 7/02* (2006.01)
*H04L 7/033* (2006.01)
H03L 7/089 (2006.01)
H03L 7/087 (2006.01)
H04L 7/04 (2006.01)

(52) U.S. Cl.
CPC ............ *H04L 7/0079* (2013.01); *H04L 7/0008* (2013.01); *H04L 7/02* (2013.01); *H04L 7/0337* (2013.01); *H03L 7/087* (2013.01); *H03L 7/0891* (2013.01); *H03L 7/0896* (2013.01); *H04L 7/04* (2013.01)

(58) Field of Classification Search
CPC ....... H04L 7/0008; H04L 7/02; H04L 7/0337; H04L 7/0334; H04L 7/033; H04L 7/027; H04L 7/04; H04L 7/0896; H04L 7/087; H04L 7/0891

USPC .......... 375/354–355, 359, 362, 371, 373–376
See application file for complete search history.

(56) References Cited

U.S. PATENT DOCUMENTS

2011/0158005 A1* 6/2011 Tyan ..................... G11C 7/222
365/189.05

FOREIGN PATENT DOCUMENTS

KR 2003-0083870 A 11/2003

OTHER PUBLICATIONS

Stefanos Sidiropoulos et al., "A Semidigital Dual Delay-Locked Loop," IEEE Journal of Solid-State Circuits, Nov. 1997, pp. 1683-1692, vol. 32, No. 11.
Kangmin Hu et al., "A 0.6 mW/Gb/s, 6.4-7.2 Gb/s Serial Link Receiver Using Local Injection-Locked Ring Oscillators in 90nm CMOS," IEEE Journal of Solid-State Circuits, Apr. 2010, pp. 899-908, vol. 45, No. 4.
Che-Fu Liang et al., "An Injection-Locked Ring PLL with Self-Aligned Injection Window," ISSCC, 2011, pp. 90-92, Session 5, PLLs, 5.2.
G.-M. Hong et al., "High-speed phase rotator using resistive interpolation for 3.75-6.9Gbit/s serial-link receiver," Electronics Letters, Apr. 12, 2012, pp. 1-2, vol. 48, No. 8.

(Continued)

*Primary Examiner* — Sam K Ahn
*Assistant Examiner* — Janice Tieu

(57) ABSTRACT

A data receiver includes a sampling clock generator configured to generate a sampling clock signal from an internal clock signal according to a data strobe signal, and a sampler configured to sample a data signal according to the sampling clock signal.

12 Claims, 8 Drawing Sheets

(56) References Cited

OTHER PUBLICATIONS

Amin Ojani et al., "A DLL-Based Injection-Locked Frequency Synthesizer for WiMedia UWB," IEEE, 2012, pp. 2027-2030.

Fatemeh Talebi et al., "A Low Phase Noise Ring—VCO Based PLL Using Injection Locking for ZigBee Applications," Circuits and Systems, 2013, pp. 304-315, Scientific Research.

Behzad Razavi, "A Study of Injection Locking and Pulling in Oscillators," IEEE Journal of Solid-State Circuits, Sep. 2004, pp. 1415-1424, vol. 39, No. 9.

Shwetabh Verma et al., "A Unified Model for Injection-Locked Frequency Dividers," IEEE Journal of Solid-State Circuits, Jun. 2003, pp. 1015-1027, vol. 38, No. 6.

\* cited by examiner

DATA RECEIVER

CROSS-REFERENCE TO RELATED APPLICATIONS

The present application claims priority to Korean Patent Application No. 10-2015-0050625, filed on Apr. 10, 2015, in the Korean Intellectual Property Office, which is incorporated herein by reference in its entirety.

BACKGROUND

1. Field

Embodiments of the present disclosure relate to a data receiver that simultaneously receives a data signal and a data strobe signal for sampling the data signal, and more particularly, to a data receiver that samples a data signal by generating a sampling clock signal from an internal clock signal using a data strobe signal.

2. Description of the Related Art

An example of a device that receives a data signal and a data strobe signal for sampling the data signal may include a memory device and a memory controller.

FIG. 1 is a block diagram illustrating a conventional memory controller 10 and a memory device 20.

The conventional memory controller 10 receives a data strobe signal DQS and a data signal DQ from the memory device 20, samples the data signal DQ according to the data strobe signal DQS, and determines a logic level of the data signal DQ.

The conventional memory controller 10 includes a delay locked loop (DLL) 11, a delay line 13, and a sampler 12. The DLL 11 receives the data strobe signal DQS and generates a sampling clock signal SCLK. The delay line 13 delays the data signal DQ. The sampler 12 samples a signal outputted from the delay line 13 according to the sampling clock signal SCLK.

FIG. 2 is a block diagram illustrating the DLL 11 of FIG. 1.

The DLL 11 includes a phase comparator 1, a filter 2, and a variable delay line 3. The phase comparator 1 compares a phase of the data strobe signal DQS with a phase of the sampling clock signal SCLK and outputs a control signal PD. The filter 2 outputs a delay control signal DCON based on the control signal PD outputted from the phase comparator 1. The variable delay line 3 delays the data strobe signal DQS in response to the delay control signal DCON, and outputs the sampling clock signal SCLK.

Referring back to FIG. 1, the DLL 11 may sample the data signal DQ by changing the phase of the data strobe signal DQS by 90 degrees. For this operation, the phase comparator 1 may compare a phase of the sampling clock signal SCLK with a phase of a signal obtained by delaying the phase of the data strobe signal DQS by 90 degrees.

While the signal delayed by 90 degrees through the DLL 11 is provided to the sampler 12, the delay line 13 delays the data signal DQ by a delay amount and provides the delayed data signal to the sampler 12. Through the above operation, the data signal DQ and the sample clock signal SCLK, which are inputted to the sampler 12, may have a phase difference of 90 degrees.

When a data transmission rate is increased, the conventional memory controller 10 activates the DLL 11 and the delay line 13 in order to lock the delay of the data signal DQ and the data strobe signal DQS. However, it is difficult to precisely adjust the timing using the DLL 11 and the delay line 13. Furthermore, for this structure, the size of the circuitry may be further increased.

The memory controller 10 and the memory device 20 have been taken as an example for description. However, the above-described problem commonly occurs in a data receiver that receives a data signal and a data strobe signal at the same time.

SUMMARY

Various embodiments of the present disclosure are directed to a data receiver that receives a data signal and a data strobe signal at substantially the same time, generates a sampling clock signal from an internal clock signal using the data strobe signal, and samples the data signal according to the sampling clock signal.

In an embodiment, a data receiver may include: a sampling clock generator configured to generate a sampling clock signal from an internal clock signal according to a data strobe signal; and a sampler configured to sample a data signal according to the sampling clock signal.

DETAILED DESCRIPTION

Figure 1:
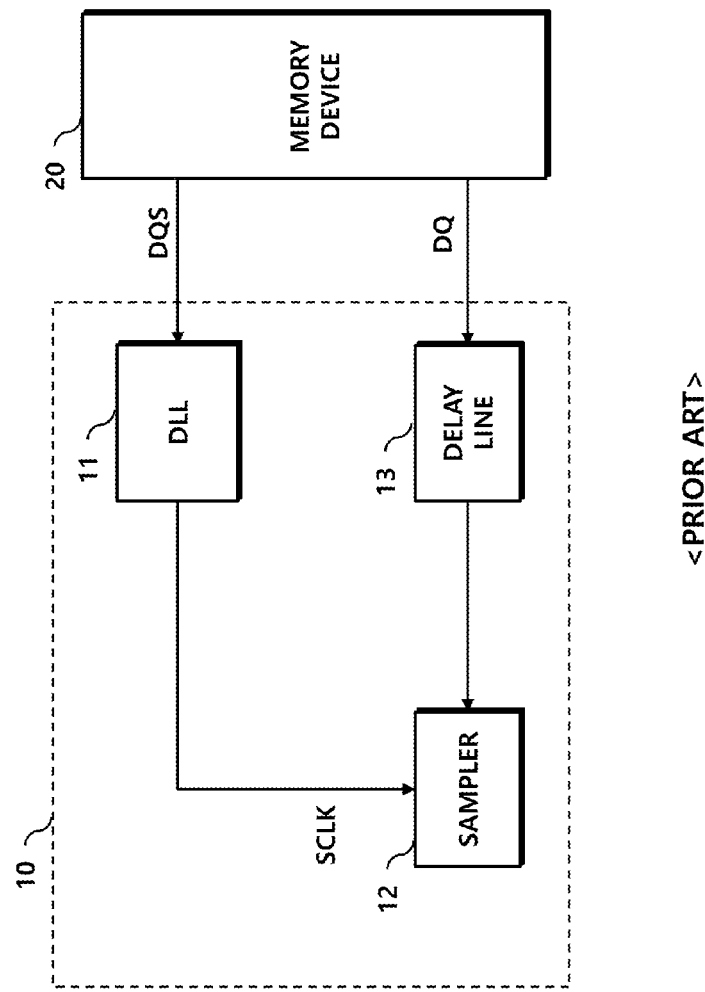
FIG. 1 is a block diagram illustrating the conventional data receiver.
Figure 2:
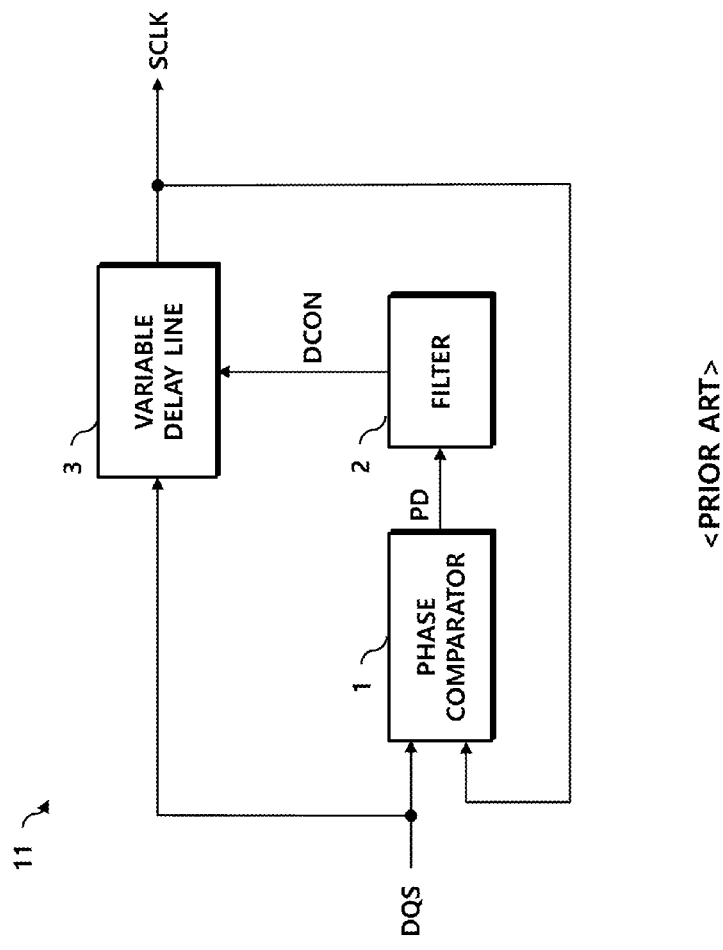
FIG. 2 is a block diagram of the DLL of FIG. 1.

Various embodiments will be described below in more detail with reference to the accompanying drawings. The present invention may, however, be embodied in different forms and should not be construed as limited to the embodiments set forth herein. Rather, these embodiments are provided so that this disclosure is thorough and complete, and fully conveys the scope of the present invention to those skilled in the art. Throughout the disclosure, like reference numerals refer to like parts throughout the various figures and embodiments of the present disclosure.

Figure 3:
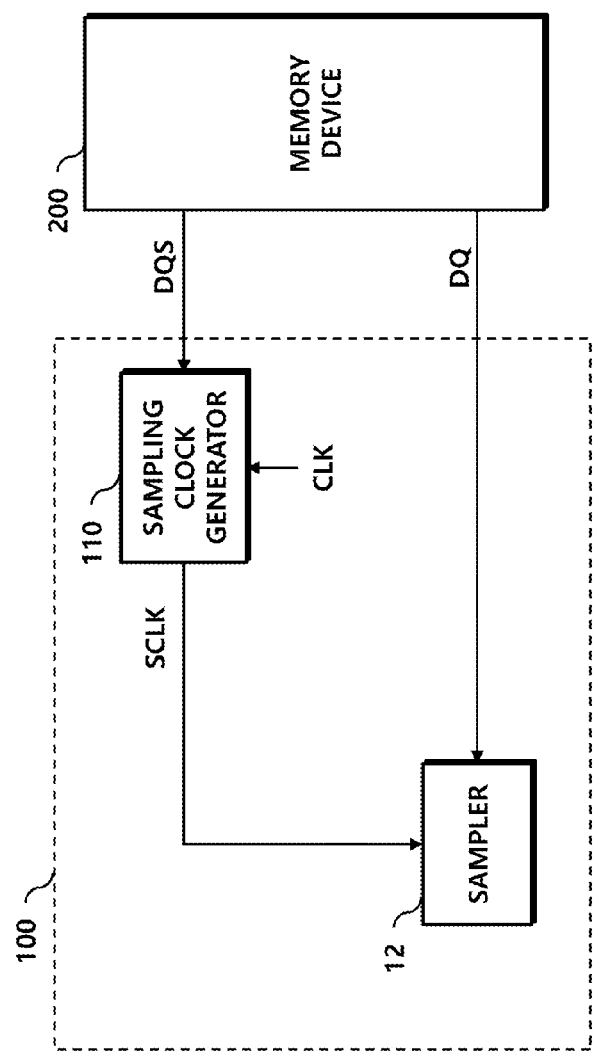
FIG. 3 is a block diagram illustrating a data receiver in accordance with an embodiment of the present disclosure.

FIG. 3 is a block diagram illustrating a data receiver in accordance with an embodiment of the present disclosure.

In the present embodiment, the data receiver is a memory controller 100, and a data transmitter is a memory device 200.

The data receiver 100 may include a sampling clock generator 110 and a sampler 12. The sampling clock generator 110 generates a sampling clock signal SCLK from an internal clock signal CLK using a data strobe signal DQS received from the memory device 200. The sampler 12 samples a data signal DQ received from the memory device 200 according to the sampling clock signal SCLK.

In the present embodiment, the sampling clock signal SCLK is in a deactivated state while the data strobe signal DQS does not toggle.

Figure 4:
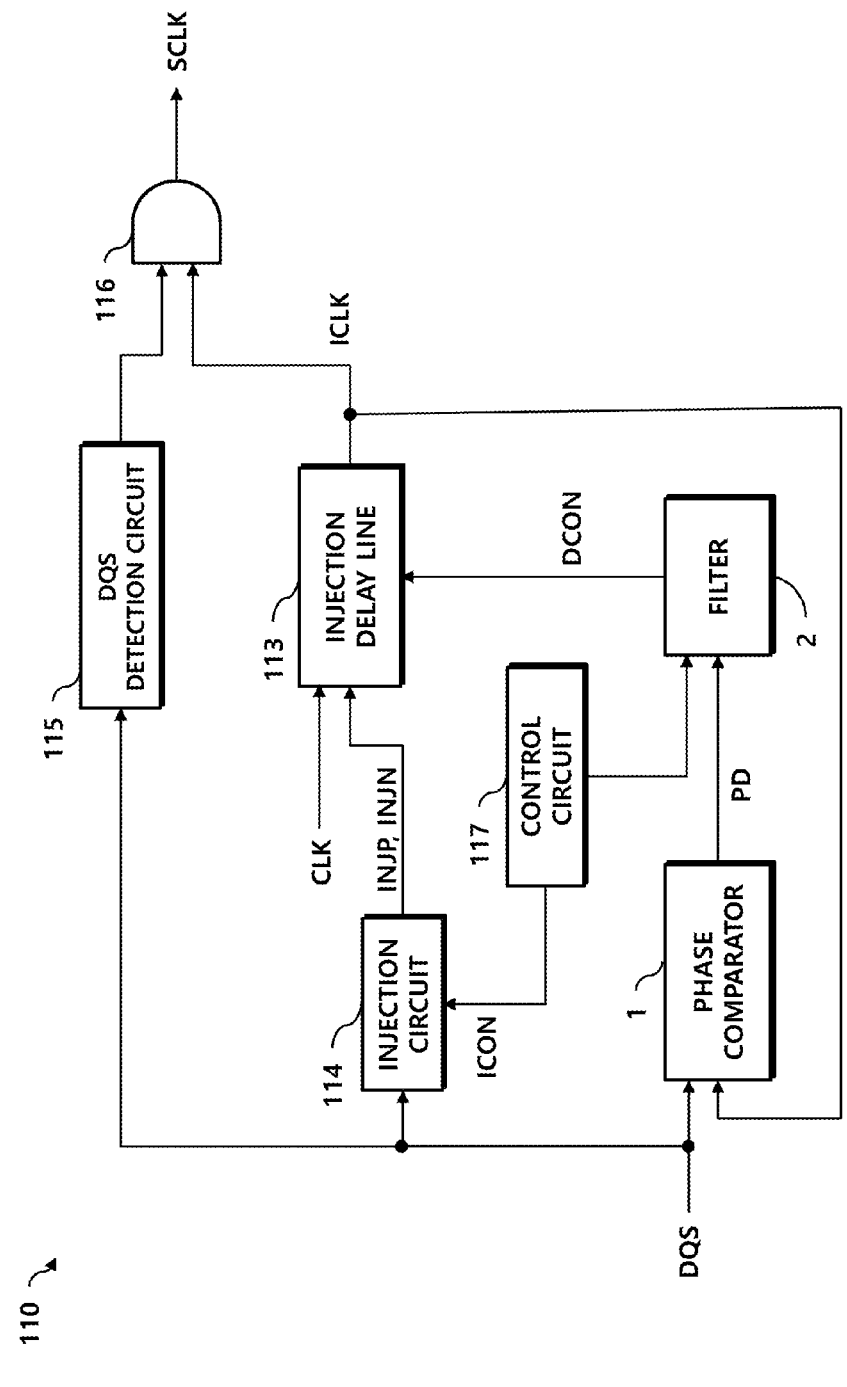
FIG. 4 is a detailed block diagram of a sampling clock generator of FIG. 3 in accordance with an embodiment of the present disclosure.

FIG. 4 is a detailed block diagram of the sampling clock generator 110 of FIG. 3 in accordance with an embodiment of the present disclosure.

The sampling clock generator 110 may include a phase comparator 1 and a filter 2. The phase comparator 1 compares a phase of the data strobe signal DQS with a phase of an injection clock signal ICLK, and outputs a phase comparison signal PD. The filter 2 outputs a delay control signal DCON based on the phase comparison signal PD.

The phase comparator 1 may compare the phase of the injection clock signal ICLK with a phase of a signal obtained by delaying the phase of the data strobe signal DQS by 90 degrees.

The sampling clock generator 110 may further include an injection circuit 114, an injection delay line 113, a data strobe signal (DQS) detection circuit 115, and a sampling clock output circuit 116. The injection circuit 114 controls the data strobe signal DQS in response to an injection control signal ICON, and outputs injection signals INJP and INJN. The injection delay line 113 variably delays the internal clock signal CLK according to the injection signals INJP and INJN and the delay control signal DCON, and outputs the injection clock signal ICLK. The data strobe signal detection circuit 115 may detect a period in which the data strobe signal DQS toggles. The sampling clock output circuit 116 performs a logical operation on both the injection clock signal ICLK and an output of the data strobe signal detection circuit 115, and outputs the sampling clock signal SCLK.

The sampling clock generator 110 may further include a control circuit 117. The control circuit 117 determines an optimal value of the injection control signal ICON in a training mode, and controls the injection circuit 114 using the injection control signal ICON.

The control circuit 117 may determine the optimal value of the injection control signal ICON while changing a value of the injection control signal ICON during a training operation.

During the training operation, the control circuit 117 may determine whether a data signal DQ having a predetermined pattern is received while the value of the injection control signal ICON changes from the minimum value to the maximum value. For example, when the injection control signal ICON has a three-bit digital value, the control circuit 117 may determine whether a data signal DQ having the predetermined pattern is received while the value of the delay control signal ICON changes from 0 to 7.

Whenever the value of the injection control signal ICON changes, the control circuit 117 may control the filter 2 to change a value of the delay control signal DCON in order to perform locking.

The control circuit 117 stores values of the injection control signal ICON when the data signal DQ having the predetermined pattern is received. The control circuit 117 determines a value of the injection control signal ICON at which a data signal DQ having an optimal value is received, among the values of the injection control signal ICON.

For example, when the data signal DQ having the predetermined pattern is received when the values of the injection control signal ICON are 4, 5, and 6, the control circuit 117 may determine the value of the injection control signal ICON to be an intermediate value, i.e., 5, of the values 4, 5, and 6, and then end the training operation.

Figure 5:
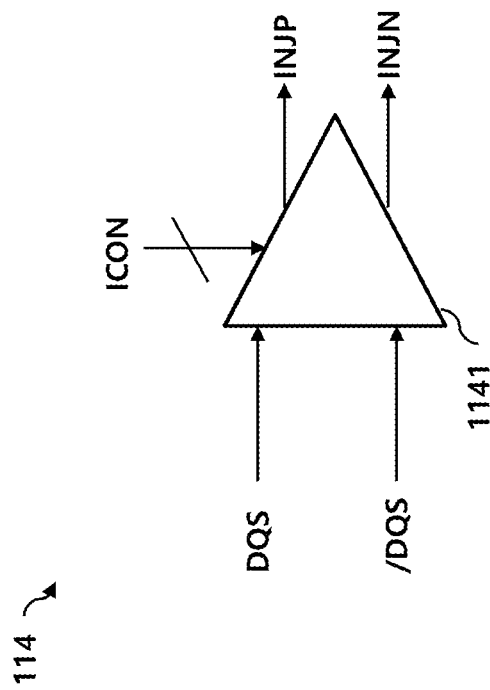
FIG. 5 is a diagram illustrating an injection circuit of FIG. 4 in accordance with an embodiment of the present disclosure.

FIG. 5 is a diagram illustrating the injection circuit 114 of FIG. 4 in accordance with an embodiment of the present disclosure.

The injection circuit 114 includes a buffer 1141, which buffers data strobe signals DQS and /DQS and outputs injection control signals INJP and INJN.

The injection control signals INJP and INJN outputted from the buffer 1141 may have substantially the same phase as the data strobe signals DQS and /DQS. Amplitudes of the injection control signals INJP and INJN may be controlled according to the injection control signal ICON.

For example, when the injection control signal ICON is a three-bit digital signal, the injection signals INJP and INJN may be controlled in eight stages from the minimum value to the maximum value. For example, the injection signal INJP may be controlled in eight 0.01V stages from 0.00V to 0.07V, and the injection signal INJN may be controlled in eight 0.01V stages from 0.93 to 1.00V.

In another embodiment, one or more of elements including the amplitudes, phases, and pulse widths of the injection signals INJP and INJN may be combined and applied according to the injection control signal ICON.

Figure 6:
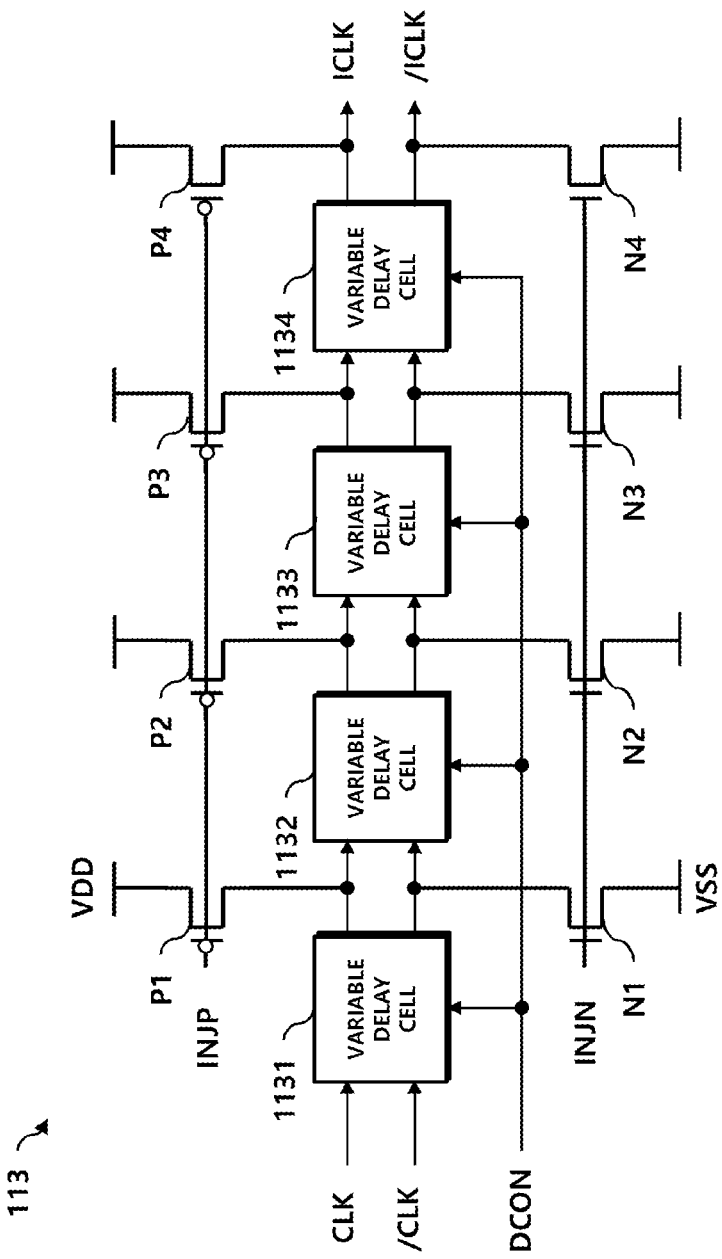
FIG. 6 is a diagram illustrating an injection delay line of FIG. 4 in accordance with an embodiment of the present disclosure.

FIG. 6 is a diagram illustrating the injection delay line 113 of FIG. 4 in accordance with an embodiment of the present disclosure.

The injection delay line 113 includes a plurality of variable delay cells 1131 to 1134 coupled in series. The plurality of variable delay cells 1131 to 1134 outputs the injection clock signal ICLK by delaying the internal clock signal CLK according to the delay control signal DCON.

The configuration of the variable delay cells 1131 to 1134 having a delay amount controlled by the delay control signal DCON can be easily modified by those skilled in the art. Thus, the detailed descriptions thereof are omitted herein.

The injection delay line 113 may further include first bias circuits P1 to P4 and second bias circuits N1 to N4. Each of the first bias circuits P1 to P4 supplies an additional current to an input or output terminal of a corresponding variable delay cell among the variable delay cells 1131 to 1134 by coupling a supply voltage terminal VDD to the input or output terminal, in response to the injection signal INJP. Each of the second bias circuits N1 to N4 supplies an additional current to an input or output terminal of a corresponding variable delay cell among the variable delay cells 1131 to 1134 by coupling a ground voltage terminal VSS to the input or output terminal, in response to the injection signal INJN.

In the present embodiment, each of the first bias circuits P1 to P4 has a gate receiving the injection signal INJP and a source and drain coupled to and disposed between the supply voltage terminal VDD and an input or output terminal of a corresponding variable delay cell. With respect to two neighboring variable delay cells among the variable delay cells 1131 to 1134, an output terminal of a front-end variable delay cell is connected to an input terminal of a back-end variable delay cell. Therefore, in FIG. 6, the drains of the first bias circuits P1 to P4 are connected to three connection lines of the variable delay cells 1131 to 1134 and the output terminal of the variable delay cell 1134, respectively.

Furthermore, each of the second bias circuits N1 to N4 has a gate receiving the injection signal INJN, and a source and drain coupled to and disposed between the ground voltage terminal VSS and an input or output terminal of a corresponding variable delay cell. In FIG. 6, the drains of the second bias circuits N1 to N4 are connected to three connection lines of the variable delay cells 1131 to 1134 and the output terminal of the variable delay cell 1134, respectively.

In another embodiment, one or both of the first bias circuit and the second bias circuit may be coupled to a current source instead of either the supply voltage terminal VDD or the ground voltage terminal VSS.

When voltage levels of the injection signals INJP and INJN are changed, each bias current from the supply voltage terminal VDD to the ground voltage terminal VSS is provided to the connection lines of the variable delay cells 1131 to 1134 and the output terminal of the variable delay cell 1134. As a result, the delay amounts of the variable delay cells 1131 to 1134 are changed, and thus the phase of the injection clock signal ICLK can be controlled.

Figure 7:
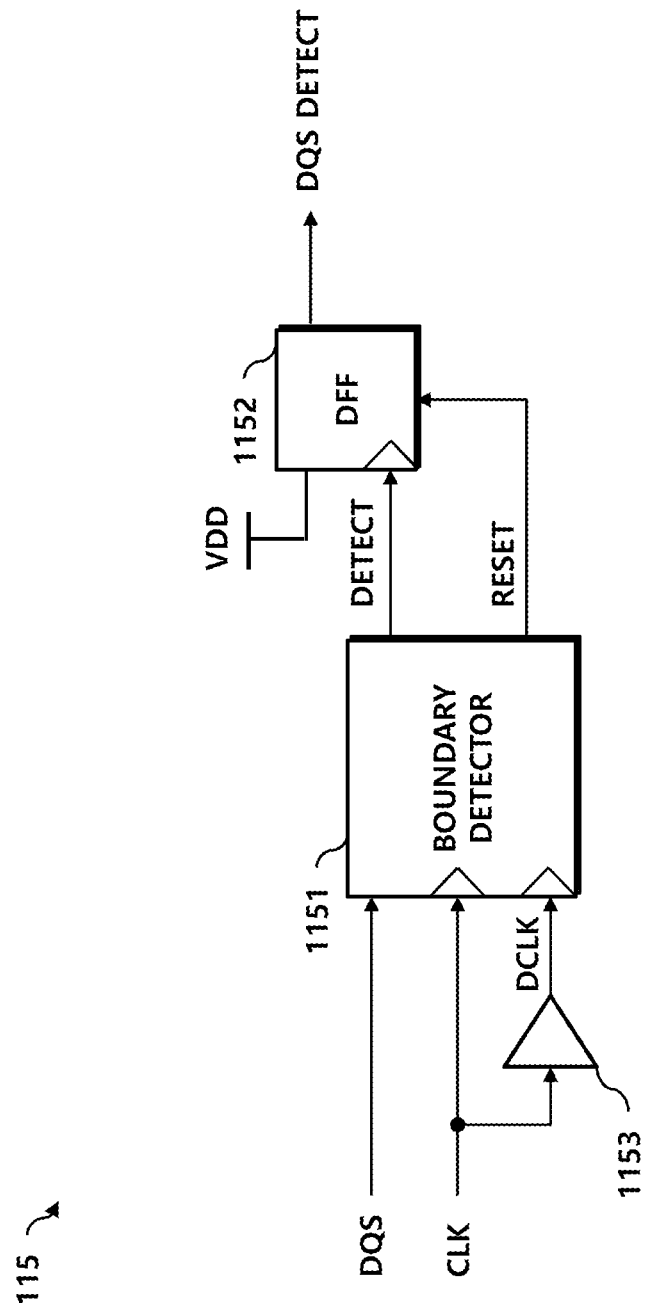
FIG. 7 is a diagram illustrating a data strobe signal detection circuit of FIG. 4 in accordance with an embodiment of the present disclosure.

FIG. 7 is a block diagram illustrating the data strobe signal detection circuit 115 of FIG. 4 according to an embodiment of the present disclosure.

The data strobe signal detection circuit 115 includes a boundary detector 1151 and a D flip-flop (DFF) 1152. The boundary detector 1151 detects a toggling period of the data strobe signal DQS according to the internal clock signal CLK and a delayed internal clock signal DCLK obtained by delaying the internal clock signal CLK, and outputs a detection signal DETECT and a reset signal RESET. The D flip-flop 1152 samples a supply voltage VDD according to the detection signal DETECT, and is reset in response to the reset signal RESET.

The boundary detector 1151 samples the data strobe signal DQS at rising and falling edges of the internal clock signal CLK and at rising and falling edges of the delayed internal clock signal DCLK.

At this time, when a sampled value is 1, the boundary detector 1151 activates the detection signal DETECT, which is activated during one cycle after the sampling. Furthermore, when the sampled value becomes zero a predetermined number of times in a row, the boundary detector 1151 activates the reset signal RESET during one cycle.

Figure 8:
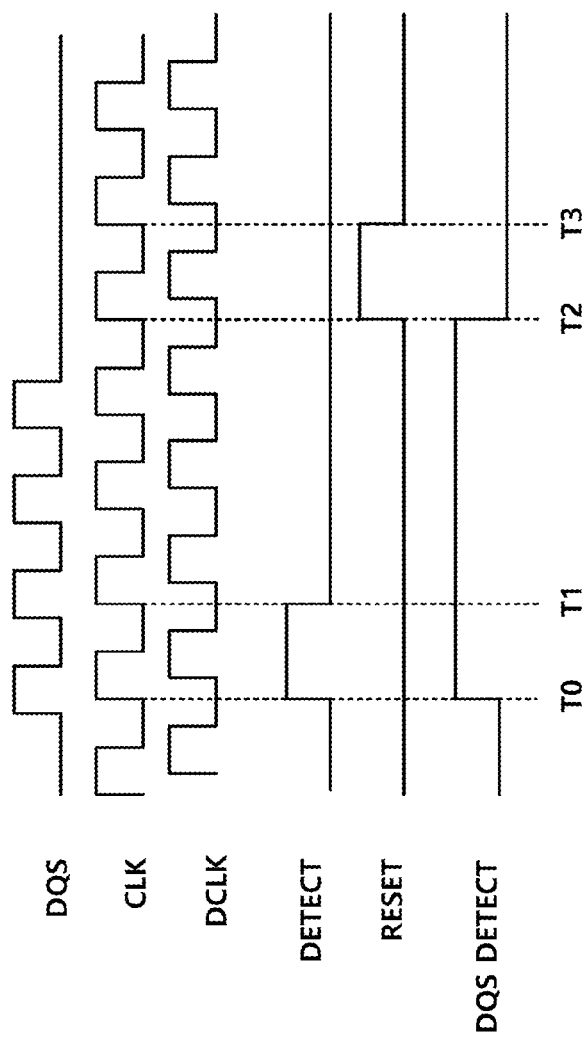
FIG. 8 is a timing diagram illustrating an operation of the data strobe signal detection circuit of FIG. 7 in accordance with an embodiment of the present disclosure.

Referring to FIG. 8, the detection signal DETECT is activated at a point of time T0, when '1' is sampled at a rising edge of the internal clock signal CLK, and is maintained in the activated state for one cycle after the point of time T0, i.e., up to a point of time T1. The reset signal RESET is activated at a point of time T2 after the point of time T1, when zero is sampled three times in a row at rising and falling edges of the internal clock signal CLK and the delayed internal clock signal DCLK, and is maintained in the activated state for one cycle after the point of time T2, i.e., up to a point of time T3.

The D flip-flop 1152 samples the supply voltage VDD at the rising edge T0 of the detection signal DETECT, and is reset at the rising edge T2 of the reset signal RESET. Thus, the D flip-flop 1152 outputs a data strobe signal detection signal DQS DETECT, which is activated in a period between the two points of time T0 and T2.

Thus, the sampling clock signal SCLK is outputted as the injection clock signal ICLK, which toggles in the activated period of the data strobe signal detection signal DQS DETECT between the two time points T0 and T2, and is deactivated to a low level in time periods other than the activated period.

In accordance with the embodiments of the present disclosure, since the data receiver generates the sampling clock signal SCLK from the internal clock signal CLK using the data strobe signal DQS, a separate DLL for locking a data signal is not used. As a result, the circuit structure of the data receiver according to embodiments of the present disclosure can be simpler than circuit structures of data receivers in the prior art.

In addition, a plurality of DLLs for a data signal and a data strobe signal do not need to be independently controlled. Thus, although the data signal is transmitted at a high speed, the data signal can be more easily and precisely sampled.

Although various embodiments have been described for illustrative purposes, it will be apparent to those skilled in the art that various changes and modifications may be made without departing from the spirit and scope of the invention as defined in the following claims.

What is claimed is:

1. A data receiver comprising:
a sampling clock generator configured to generate a sampling clock signal from an internal clock signal according to a data strobe signal; and
a sampler configured to sample a data signal according to the sampling clock signal,
wherein the sampling clock generator comprises:
an injection circuit configured to generate an injection signal from the data strobe signal according to an injection control signal;
an injection delay line configured to delay the internal clock signal according to a delay control signal and the injection signal, and to output an injection clock signal;
a phase comparator configured to compare a phase of the injection clock signal with a phase of the data strobe signal; and
a filtering circuit configured to output the delay control signal according to an output of the phase comparator.

2. The data receiver of claim 1, wherein the sampling clock generator further comprises a data strobe signal detection circuit configured to detect a period in which the data strobe signal toggles.

3. The data receiver of claim 2, wherein the sampling clock generator further comprises a sampling clock output circuit configured to perform a logical operation on the injection clock signal and an output of the data strobe signal detection circuit, and to output the sampling clock signal.

4. The data receiver of claim 2, wherein the data strobe signal detection circuit comprises:
a boundary detector configured to detect the toggling period of the data strobe signal according to the clock signal, the toggling period including a starting point and an ending point; and
a flip-flop configured to output a signal that is activated at a first point of time corresponding to the starting point and deactivated at a second point of time corresponding to the ending point.

5. The data receiver of claim 4, wherein the flip-flop comprises a D flip-flop that samples a supply voltage at the first point of time and is reset at the second point of time.

6. The data receiver of claim 1, wherein the injection circuit controls amplitude of the data strobe signal according to the injection control signal and outputs the injection signal.

7. The data receiver of claim 1, wherein the injection delay line comprises:
a plurality of variable delay cells configured to sequentially delay the internal clock signal by a delay amount controlled according to the delay control signal; and
a bias circuit configured to control a bias of an input or output terminal of each of the variable delay cells in response to the injection signal.

8. The data receiver of claim 7, wherein the bias circuit comprises a plurality of MOS transistors, each of the MOS transistors having a gate configured to receive the injection signal and a source and drain coupled to and disposed between any one of a supply voltage terminal, a ground voltage terminal, and an output terminal of a current source, and a corresponding node connected to one or more of the input and output terminals of the variable delay cells.

9. The data receiver of claim 1, wherein the sampling clock generator further comprises a control circuit configured to determine an optimum value of the injection control signal in a training mode.

10. The data receiver of claim 9, wherein the control circuit determines the optimum value of the injection control signal among candidate values of the injection control signal when a data signal having a predetermined pattern is received, while swapping a value of the injection control signal from a minimum value to a maximum value.

11. The data receiver of claim 10, wherein the injection signal is determined as an intermediate value among the candidate values of the injection control signal.

12. The data receiver of claim 1, wherein the data receiver comprises a memory controller or a memory device.

* * * * *